(12) United States Patent
Inomoto (10) Patent No.: US 6,501,104 B2
(45) Date of Patent: Dec. 31, 2002

(54) HIGH SPEED SEMICONDUCTOR PHOTODETECTOR

(75) Inventor: Yasumasa Inomoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/834,648

(22) Filed: Apr. 16, 2001

(65) Prior Publication Data
US 2001/0030330 A1 Oct. 18, 2001

(30) Foreign Application Priority Data
Apr. 17, 2000 (JP) ........................ 2000-121052

(51) Int. Cl.[7] .................. H01L 31/072; H01L 31/109; H01L 31/0328; H01L 31/0336
(52) U.S. Cl. .................. 257/186; 257/127; 438/624
(58) Field of Search .................. 257/186, 127; 438/624, 626, 631

(56) References Cited
U.S. PATENT DOCUMENTS
6,049,638 A * 4/2000 Norimatsu et al. ........... 385/14

FOREIGN PATENT DOCUMENTS
JP 5-82829 * 4/1993

* cited by examiner

Primary Examiner—David Nelms
Assistant Examiner—Andy Huynh
(74) Attorney, Agent, or Firm—Foley & Lardner (57) ABSTRACT

A first semiconductor mesa structure having a photoactive region and a second semiconductor mesa structure are formed side by side on a semi-insulating substrate and surrounded with a photoresist layer. The mesa structures and the surrounding photoresist layer are covered with a metal layer, on which is placed a photoresist mask. Conductive material is deposited through the photoresist mask to form a number of metallized regions on the metal layer. After removing the photoreist mask, the metallized regions are used as a mask for patterning the underlying metal layer into metal regions corresponding to the metallized regions. The metallized regions and the underlying patterned metal regions form two laminated metal structures for positive and negative electrodes. One of the laminated metal structures forms an interconnect metal line along the sidewalls of a valley between the two mesa structures or across the valley to form a bridge.

5 Claims, 9 Drawing Sheets

HIGH SPEED SEMICONDUCTOR PHOTODETECTOR

BACKGROUND OF THE INVENTION

1. Field of the Invention

The present invention relates generally to semiconductor photodetectors, and more specifically to a high speed semiconductor photodetector and a method of fabricating the photodetector.

2. Description of the Related Art

As disclosed in Japanese Patent Publication 5-82829, a semiconductor photodetector is formed in a mesa structure in which the light-sensitive area is separated from the pad electrode by a V-shaped groove. Because of the V-groove separation, a large surface area is obtained without increasing parasitic capacitance and hence high speed operation of the device is possible. As a reliable material TiPtAu is used for the pad electrode and metal lines. Wet and dry etching processes are available for etching the metal compound. However, because of the absence of appropriate etchant for the composition Pt if wet etching is employed and because of the difficulty to achieve constant etch rate if dry etching is used, a technique known as "liftoff process" is used, instead of the metal etching process. Using the liftoff process, a thick layer of photoresist is patterned on the surface of the mesa structure and then a thin layer of metal is deposited using evaporation. The device is immersed in a solution capable of dissolving the photoresist. The pad and metal lines that were deposited directly on the semiconductor remain, while the metal deposited on the resist lifts off of the device as the resist dissolves.

However, one shortcoming of the liftoff process is poor step coverage. Since the metal evaporation process has a directional characteristic, the metal deposited at stepped portions is thinned and tends to break under stress. Another shortcoming is that the Au of the deposited metal exhibits an undesirable characteristic because its high metalleability causes a burr to occur when the metal on the photoresist is separated from the metal on the semiconductor. As a result, fifty percent of the metal lines actually produced has a poor configuration.

SUMMARY OF THE INVENTION

It is therefore an object of the present invention to provide a high speed semiconductor photodetector of high reliability and a method of fabricating the photodetector.

Another object of the present invention is to provide a high speed semiconductor photodetector which can be manufactured with high yield and a method of fabricating the photodetector.

According to one aspect of the present invention, there is provided a semiconductor photodetector comprising a semi-insulating substrate, a first layered-semiconductor mesa structure and a second layered-semiconductor mesa structure formed side by side on the substrate, the first layered-semiconductor mesa structure having a photoactive region and a first electrode on the photoactive region and the second layered-semiconductor mesa structure having a pad electrode, and an interconnect line of laminated metal structure for establishing a connection between the first electrode and the pad electrode.

Specifically, the laminated metal structure comprises a lower metal layer and an upper metal layer, the upper metal layer having a greater thickness than the thickness of the lower metal layer. In one embodiment of the present invention, the interconnect line extends along sidewalls of a valley between the first and second semiconductor mesa structures. In a modified embodiment, the interconnect line extends as a bridge over a void between the first and second semiconductor mesa structures.

According to a second aspect to the present invention, there is provided a method of fabricating a semiconductor photodetector comprising the steps of (a) forming a first layered-semiconductor mesa structure having a photoactive region and a second layer-semiconductor mesa structure side by side on a semi-insulating substrate, (b) enclosing the first and second layered-semiconductor mesa structures with a protective layer, (c) patterning the protective layer to form a contact hole therein and filling the contact hole with conductive material to form a first electrode on the photoactive region, (d) surrounding the first and second layered-semiconductor mesa structures with a photoresist layer by excluding an elongate portion that extends along sidewalls of a valley between the mesa structures, (e) covering the mesa structures and the surrounding photoresist layer with a metal layer, (f) forming on the metal layer a mask having patterns of the first electrode, the elongate portion and a pad electrode on the second mesa structure, (g) selectively depositing conductive material through the mask to form a plurality of metallized regions on the metal layer, (h) removing the mask and patterning the metal layer into a plurality of regions corresponding to the metallized regions by using the metallized regions as a mask, and (i) removing the surrounding photoresist layer. The metallized regions and patterned metal regions form two laminated metal structures for positive and negative electrodes. The elongate portion is deposited with one of the laminated structures.

According to a third aspect, the present invention provides a modified method in which an air bridge process is used for fabricating the interconnect metal line. The modified method comprises the steps of (a) forming a first layered-semiconductor mesa structure having a photoactive region and a second layered-semiconductor mesa structure side by side on a semi-insulating substrate, (b) enclosing the first and second layered-semiconductor mesa structures with a protective layer, (c) patterning the protective layer to form a contact hole therein and filling the contact hole with conductive material to form a first electrode on the photoactive region, (d) surrounding the first and second layered-semiconductor mesa structures with a photoresist layer by filling a valley therebetween with the photoresist layer, (e) covering the mesa structures and the surrounding photoresist layer with a metal layer, (f) forming on the metal layer a mask having patterns of the first electrode, an elongate portion that crosses over the valley and a pad electrode on the second mesa structure, (g) selectively depositing conductive material through the mask to form a plurality of metallized regions on the metal layer, (h) removing the mask and patterning the metal layer into a plurality of metal regions corresponding to the metallized regions by using the metallized regions as a mask, and (i) removing the surrounding photoresist layer. The metallized regions and patterned metal regions form two laminated metal structures for positive and negative electrodes. The valley-crossing elongate portion is composed of one of the laminated structures and takes in the shape of a bridge.

Preferably, the surrounding photoresist layer of the step (d) partially covers edge portions of the mesa structures, and the step (d) comprises the step of hard-baking the photoresist layer to form downwardly sloping contour at inner fringe portions of the surrounding photoresist layer. In a preferred embodiment, the step (h) is performed by using an ion milling process.

BRIEF DESCRIPTION OF THE DRAWINGS

The present invention will be described in detail further with reference to the following drawings, in which.

DETAILED DESCRIPTION

In FIGS. 1A to 6C, a semiconductor photodetector of the present invention is shown in a sequence of fabrication stages according to a first embodiment of the present invention.

Figure 1A:
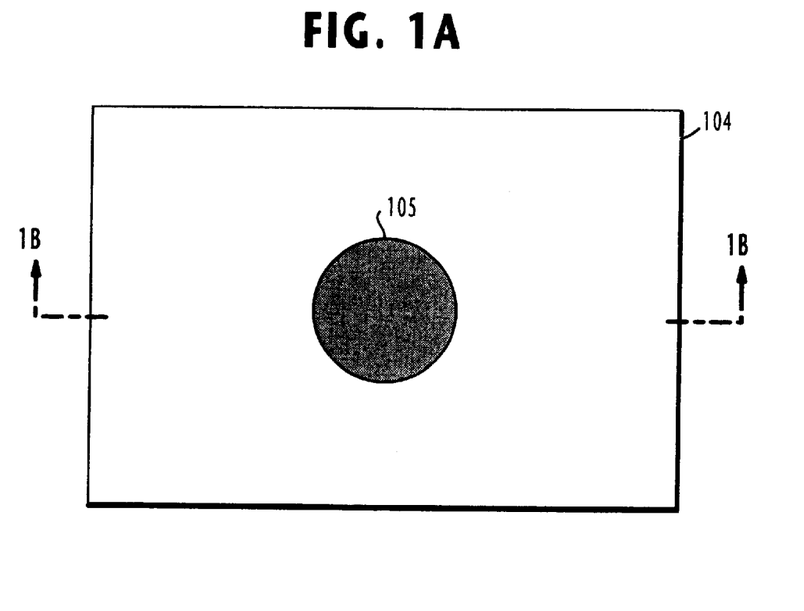
FIG. 1A is a plan view of a semiconductor photodetector of the present invention during initial steps of device fabrication.
Figure 1B:
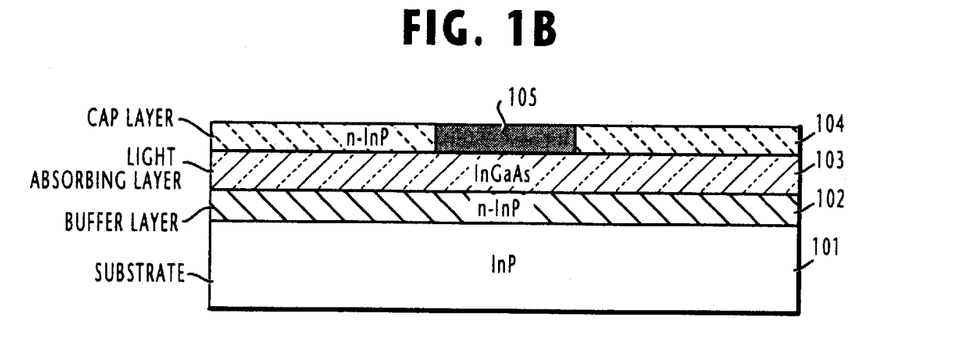
FIG. 1B is a cross-sectional view taken along the lines 1B—1B of FIG. 1A.

In FIGS. 1A and 1B, an Fe-doped high-resistance InP semi-insulating substrate 101 with a thickness of 300 to 500 $\mu$m is used as a starting member. On the substrate 101 is deposited an n-type 1-$\mu$m thick InP buffer layer 102 with a carrier concentration of $1 \times 10^{18}$ cm$^{-3}$ which is then covered with a undoped 2-$\mu$m thick InGa As light absorbing layer 103 with a carrier concentration of $1 \times 10^{15}$ cm$^{-3}$. On the absorbing layer 103 is a 1-$\mu$m thick n-type InP cap layer 104 with a carrier concentration of $1 \times 10^{16}$ cm$^{-3}$. Using a patterned photomask, not shown, zinc is thermally diffused into the cap layer 104. The diffused region of the cap layer is converted to p-type InP to function as a photoactive region 105.

Figure 2A:
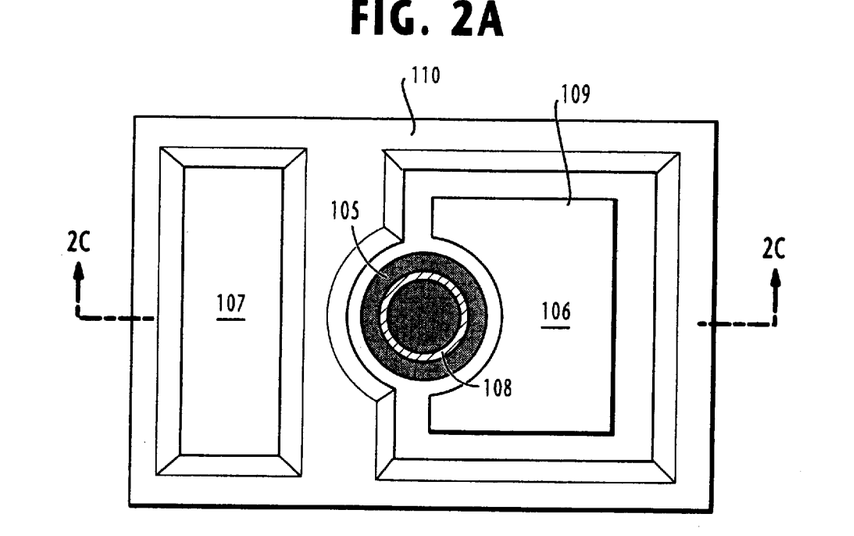
FIG. 2A is a plan view of the photodetector during a second step of the fabrication in which layers of semiconductor are segmented into two mesa structures.
Figure 2B:
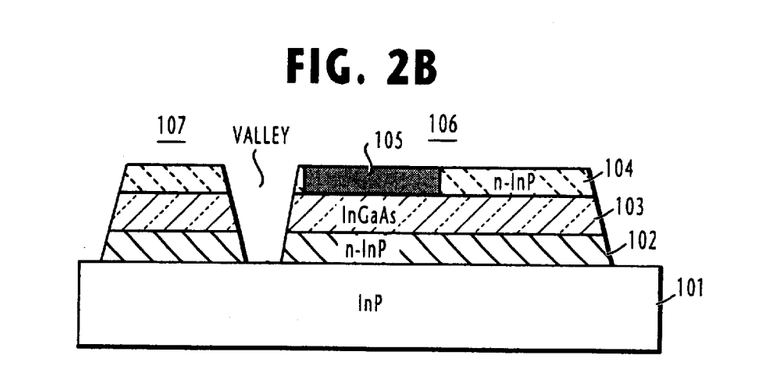
FIG. 2B is a cross-sectional view of the device immediately after the mesa structures are formed.

The device is then selectively etched with a solution of bromine and methanol through a photoresist, not shown, until portions of the upper surface of semi-insulating substrate 101 are exposed to create two mesa structures, i.e., a light-sensitive portion 106 and a pad electrode portion 107 electrically separated by a steep valley from the photoactive region 105, as shown in FIG. 2B.

Figure 2C:
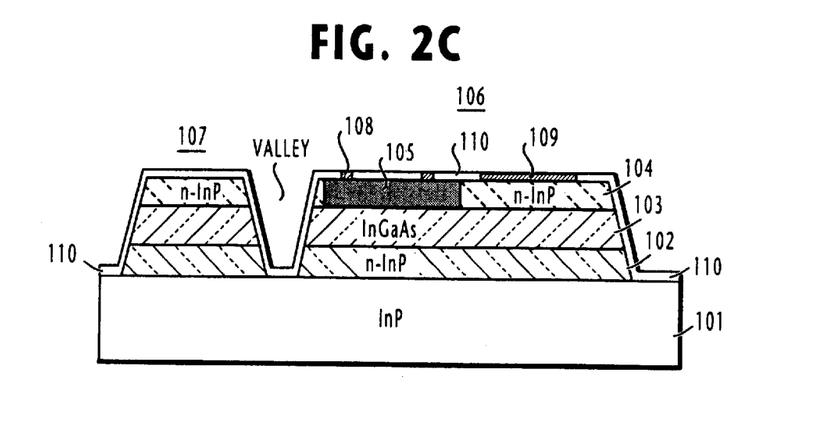
FIG. 2C is a cross-sectional view of the device taken along the lines 2C—2C of FIG. 2A when the mesa structures are covered with a protective layer.

As shown in FIG. 2C, the device is entirely coated with an SiN$_x$ protection film 110 using a plasma CVD method. In order to function as an anti-reflection film on the surface of photoactive region 105 as well as a protective coat, the protection film 110 has a thickness of $\lambda/4n$, where $\lambda$ is the wavelength of incidentlight and n is the refractive index of the protection film 110. Two contact holes are created in a portion of the protection film 110 which coats the photoactive mesa structure 106. One is a ring opening over the photoactive region 105 and the other is a rectangular opening on the cap layer 104 with one side having inwardly curved arc (see FIGS. 2A and 2C). Using the liftoff method, a 100-nm thick, ring-shaped positive contact electrode 108 formed of AnZn is deposited on the photoactive region 105, and a 100-nm thick, negative contact electrode 109 formed of AuGeNi is deposited on the cap layer 104. The device is then subjected to a sintering process in an H$_2$ environment.

Figure 3A:
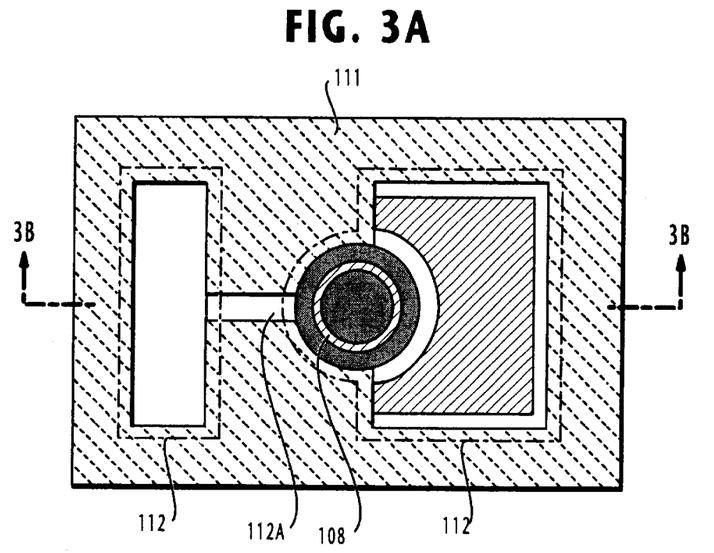
FIG. 3A is a plan view of a photodetector of a first embodiment of this invention during a third step of the fabrication in which the two mesa structures are surrounded with a photoresist layer except for a portion of the valley therebetween.
Figure 3B:
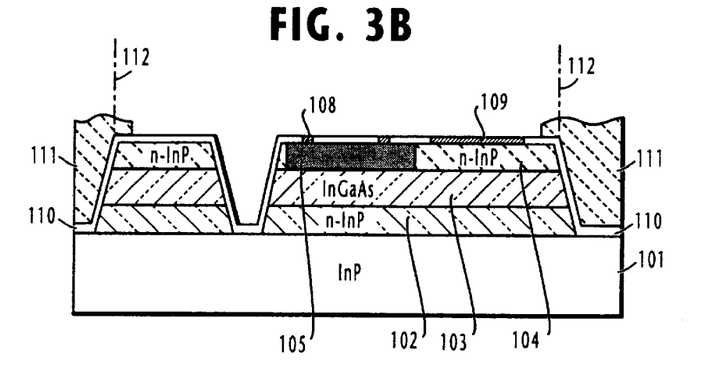
FIG. 3B is a cross-sectional view of the device taken along the lines 3B—3B.
Figure 3C:
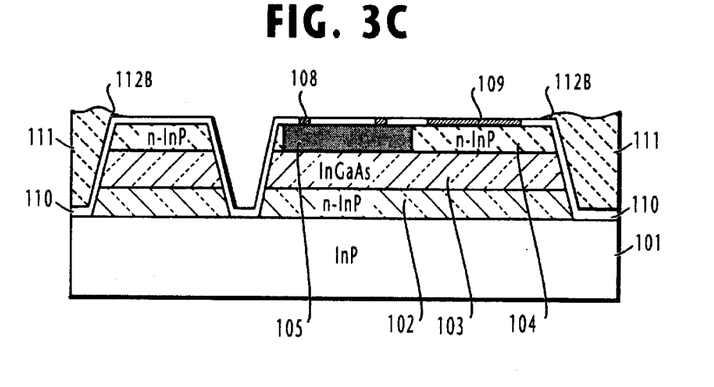
FIG. 3C is a cross-sectional view of the device when the photoresist layer is hard-baked.

As shown in FIGS. 3A and 3B, the device is coated with a thick layer of novolac photoresist which is then exposed to an imagewise radiation so that it surrounds the steep edges of the mesa structures 106 and 107 as indicated by numeral 111. Photoresist layer 111 extends inwardly from the steep edges 112 of the mesa structures to cover edge portions of their upper surfaces. However, the photoresist layer 111 is not provided on a narrow region 112A of the steep valley in which an interconnect metal line is to be formed. The surrounding photoresist layer 111 is then hard-baked at a temperature of 160° C. As a result of this hard baking, the fringes of the mesa-surrounding resist layer 111 that extend inwards from the edges of the resist layer 111 are flattened and form a contour sloping downwards to the protected upper surface of the mesas portions 106 and 107 as indicated at 112B (FIG. 3C).

Figure 4A:
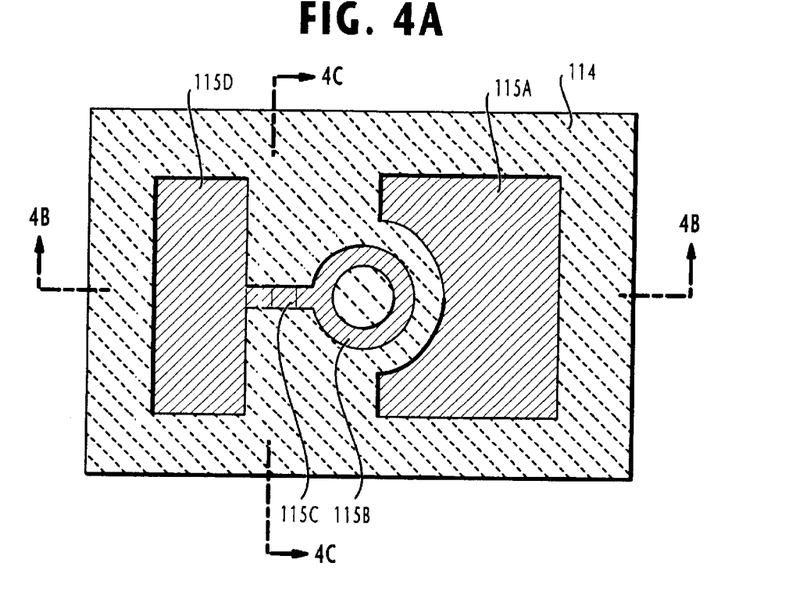
FIG. 4A is a plan view of the photodetector during a fourth step of the fabrication in which a metal layer is deposited followed by the deposition of a photoresist mask and a metallization process.
Figure 4B:
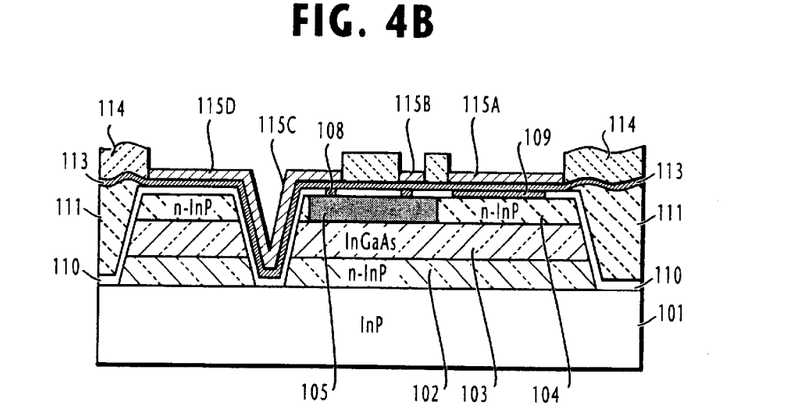
FIG. 4B is a cross-sectional view of the device taken along the lines 4B—4B.
Figure 4C:
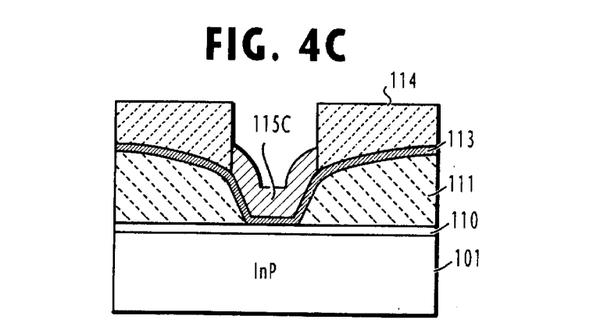
FIG. 4C is a cross-sectional view of the device taken along the lines 4C—4C of FIG. 4A.

In FIGS. 4A, 4B and 4C, the device is entirely covered with a 150-nm thick metal film 113. This is done by consecutively evaporating Ti, Pt and Au, each with a thickness of 50 nanometers. Metal film 113 is coated with a thick photoresist layer, which is then subjected to an imagewise radiation so that the resist layer is patterned into a photomask 114. During a subsequent metallization process, the photomask 114 is used as a mask to selectively deposit Au on the metal film 113 to form 1-μm thick metallized regions 115A, 115B, 115C and 115D. Metal film 115A has a pattern somewhat oversize of the negative contact electrode 109 that underlies the metal sheet 113 below the metallized region 115A, and the metallized region 115B is likewise oversize of the underlying positive, ring-shaped contact electrode 108. Metallized region 115C is a narrow strip that extends between the ring-shaped metal film 115B and the metallized region 115D which is formed in the shape of a rectangle on the surface of pad electrode mesa 107. Photomask 114 is then removed.

Figure 5A:
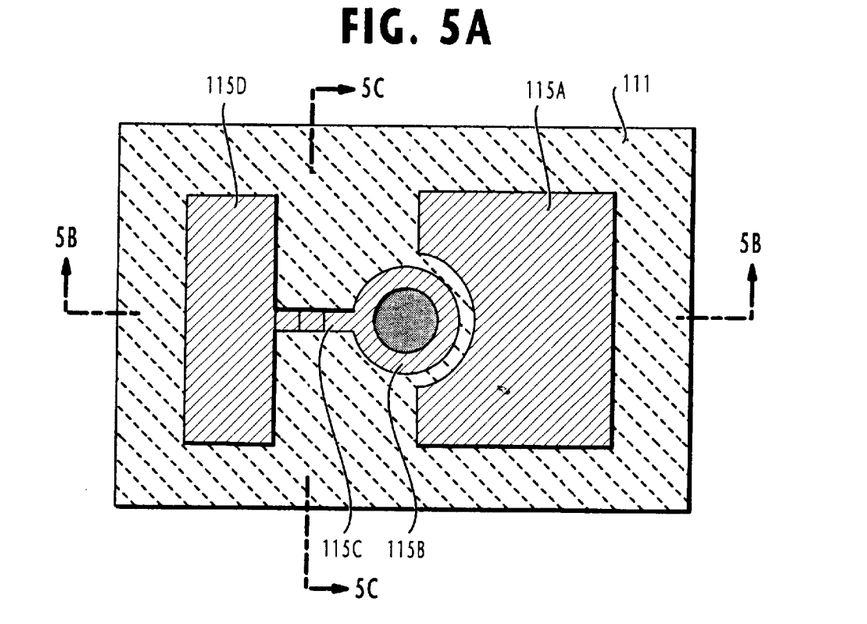
FIG. 5A is a plan view of the photodetector during a fifth step of the fabrication in which the photoresist mask is removed.
Figure 5B:
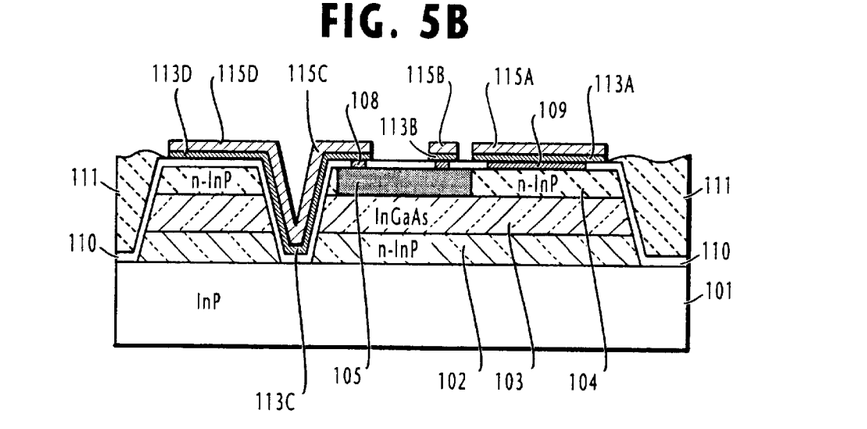
FIG. 5B is a cross-sectional view taken along the lines 5B—5B of FIG. 5A.
Figure 5C:
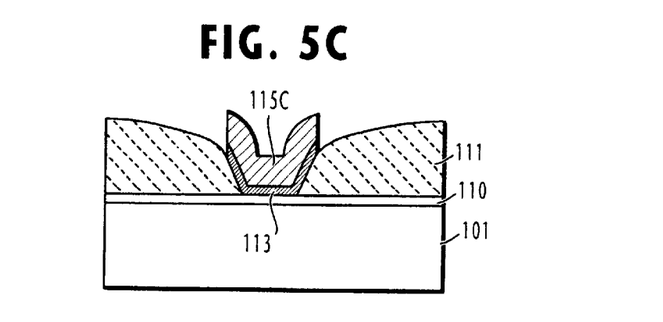
FIG. 5C is a cross-sectional view taken along the lines 5C—5C of FIG. 5A.

Since the TiPtAu metal film 113 entirely covers the underlying conductive areas, the next step is an ion milling process in which Ar is used to remove unnecessary portions of the metal sheet by using the Au-metallized regions 115A to 115D as a mask (see FIGS. 5A to 5C). As a result, the metal film 113 is segmented into a plurality of TiPtAu regions 113A, 113B, 113C and 113D of upper metallized regions 115A, 115B, 115C and 115D. It is seen that all of these metallized regions 115A to 115D form two-layered structures with underlying conductive regions 113A to 13D. Accordingly, the conductive region 115A establishes contact with the negative contact electrode 109 and the region 115D establishes contact with the positive ring-shaped contact electrode 108 via regions 115B and 115C. For external connection, the conductive regions 115A and 115D are used as a negative and a positive electrode, respectively.

Each of the positive and negative electrodes is thus formed with a two-layered laminated structure, with the upper metal layer 115 having a greater thickness than the thickness of the lower metal layer 113.

Figure 6A:
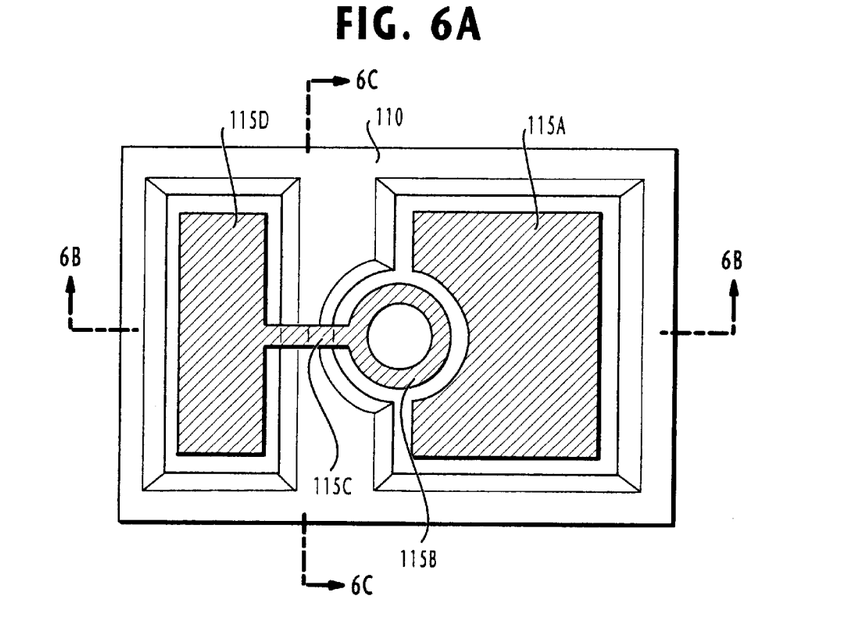
FIG. 6A is a plan view of the photodetector during a final step of the fabrication of the device of the first embodiment in which the surrounding baked photoresist mask is removed.
Figure 6B:
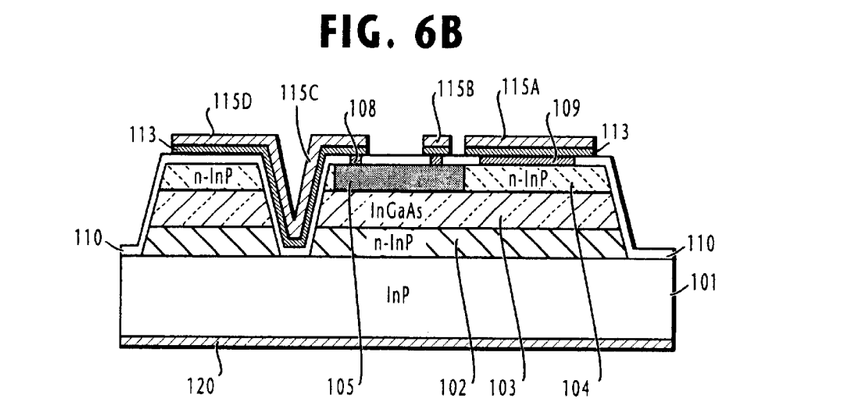
FIG. 6B is a cross-sectional view taken along the lines 6B—6B of FIG. 6A.
Figure 6C:
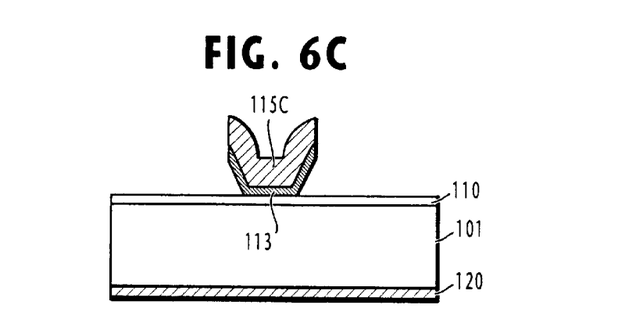
FIG. 6C is a cross-sectional view taken along the lines 6C—6C of FIG. 6A.

Photoresist layer 111 is then removed as shown in FIGS. 6A, 6B and 6C. The bottom surface of semi-insulating substrate 101 is polished to a depth of 150 μm and a rear-side electrode 120 is formed by consecutively evaporating AuGeNi/Ti/Au to respective thicknesses of 1000/500/2000 Angstrom.

One feature of the laminated structure of the present invention is that an interconnect metal line of desired thickness can be deposited on the V-shaped steep valley between the two mesa structures even if the valley has steep sidewalls of more than 50 degrees to the horizontal. Since an increase in the thickness of the interconnect metal line results in a low line resistance which allows the photodetector to operate at high speeds. Further, the interconnect line is strengthened and possible line cuts and faults which might be caused by the mechanical stress of the valley structure are prevented.

Another feature of the present invention is that, since the photoresist layer 114 is used as a mask for depositing the metallized Au-regions 115, precision patterning of the positive and negative electrodes is achieved. This avoids poor metal patterns associated with the liftoff method.

Still further feature of the present invention is that the downwardly sloping fringes of the hard-baked mesa-surrounding resist layer 111 permit complete removal of the undesired edge portions of overlying metal patterns 113 with the use of the ion milling method which is characterized by its significant directionality. As a result, the electrodes can be formed with a greater degree of precision.

A yield of more than 90 percent and a cutoff frequency of 15 GHz at a bias voltage of −5 volts were obtained for the photodetectors of the present invention.

In a modified embodiment of the present invention shown in FIGS. 7A to 9C, the interconnect metal line is fabricated according to the air bridge method. In this modification, the same process is used as that of the previous embodiment until the protection coat 110 is formed. Therefore, the process steps shown in FIGS. 1A to 2C is applied to this embodiment. Thus, in FIGS. 7A to 9C the process starting on the basis of FIGS. 1A to 2C is illustrated.

Figure 7A:
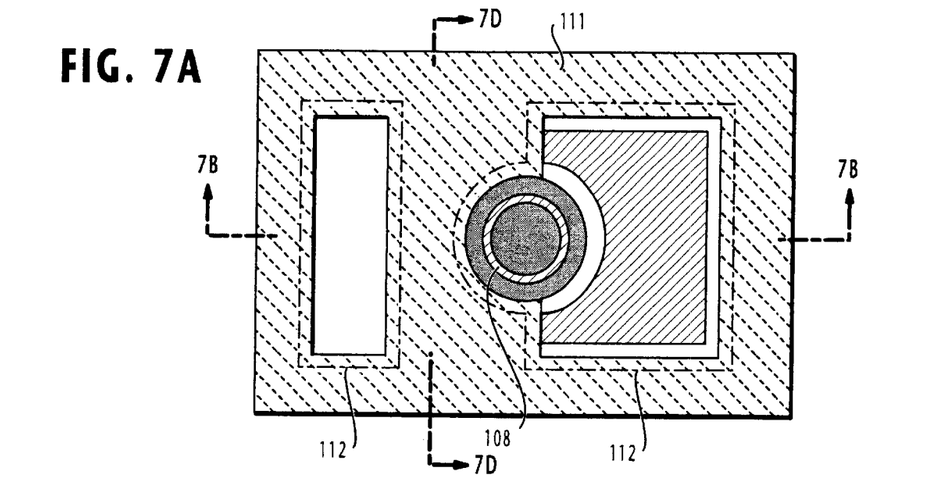
FIG. 7A is a plan view of a photodetector during one step of the fabrication of the device of a second embodiment of this invention corresponding to the third step of the first embodiment.
Figure 7B:
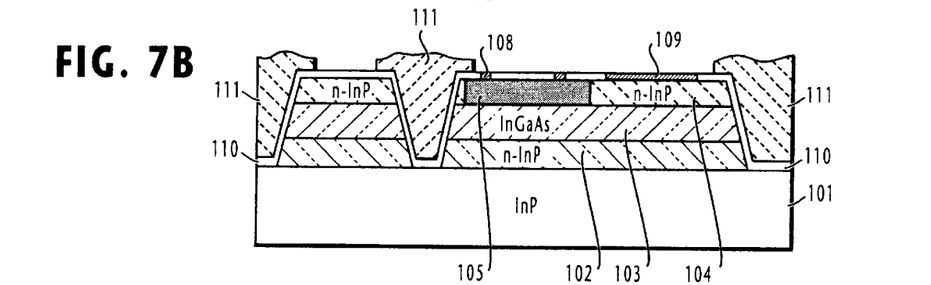
FIG. 7B is a cross-sectional view taken along the lines 7B—7B of FIG. 7A when the two mesa structures are surrounded, with a photoresist layer.
Figure 7C:
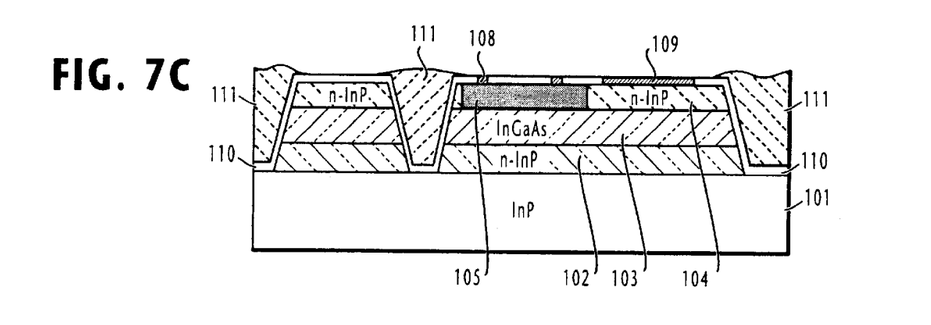
FIG. 7C is a cross-sectional view of the device when the photoresist layer is hard-baked.
Figure 7D:
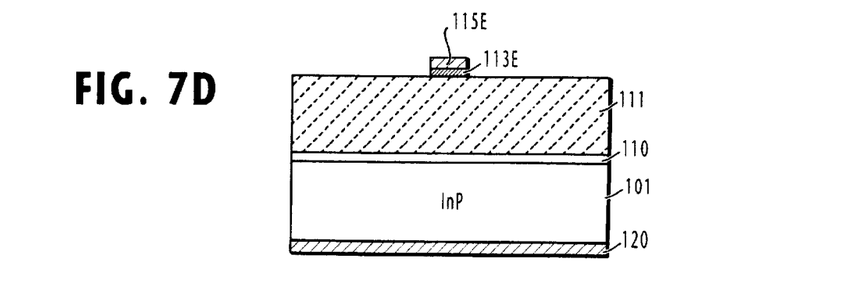
FIG. 7D is a cross-sectional view taken along the lines 7C—7D of FIG. 7A.

Photoresist layer 111 is deposited in a manner identical to the previous embodiment except that is the valley between the two mesa structures is filled with the photoresist as seen from FIGS. 7A and 7B. Similar to the previous embodiment, the device is hard-baked at 160° C. to cause the resist layer 111 to form downwardly sloping fringes extending inwards from the edges of the upper surface of the mesa structures, as shown in FIG. 7C.

Figure 8A:
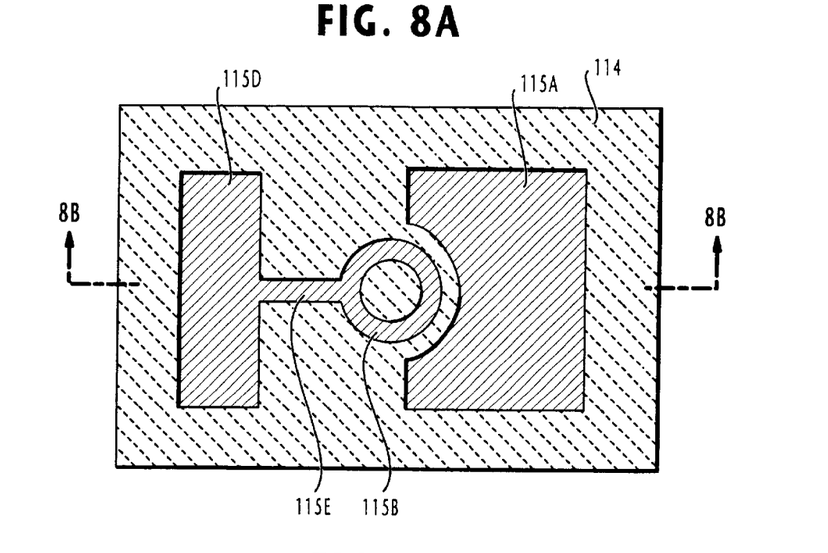
FIG. 8A is a plan view of a photodetector during a subsequent step of the fabrication according to the second embodiment corresponding to the fourth step of the first embodiment.
Figure 8B:
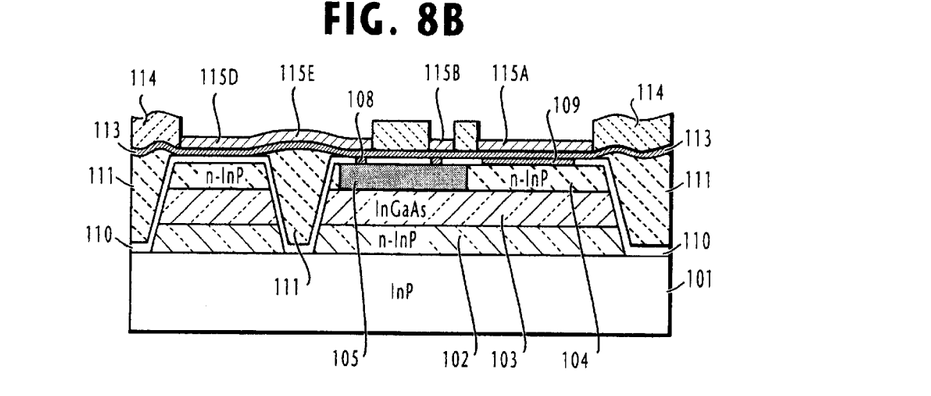
FIG. 8B is a cross-sectional view taken along the lines 8B—8B of FIG. 8A when the two mesa structures are surrounded with a photoresist layer.
Figure 8C:
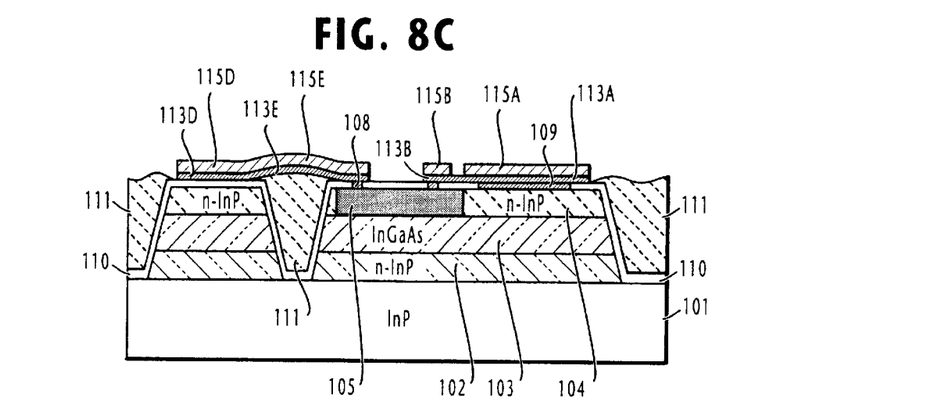
FIG. 8C is a cross-sectional view of the device when the photoresist layer is hard-baked.

In FIGS. 8A to 8C, the metal film 113 is deposited on the device by consecutively evaporating Ti, Pt and Au, each with a thickness of 50 nanometers, followed by the formation of the patterned photoresist layer 114 on the metal layer 113. The patterned resist layer 114 serves as a mask for metallizing the device with Au to form conductive regions 115A, 115B, 115E and 115D.

Figure 9A:
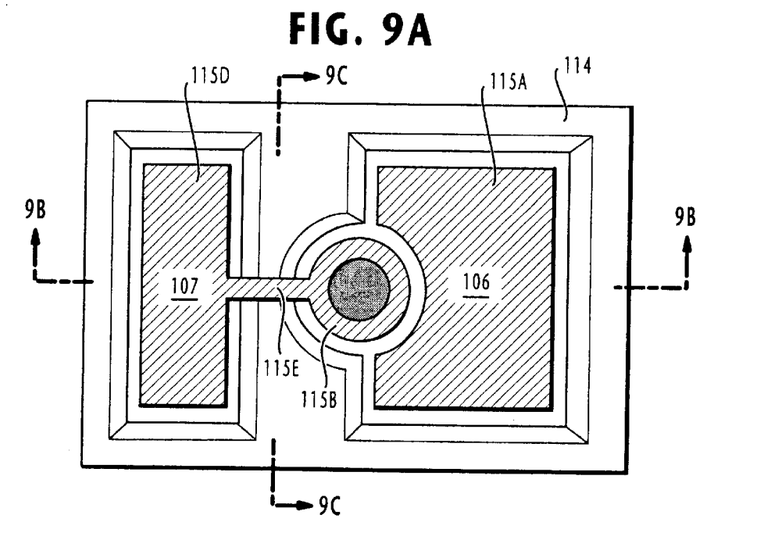
FIG. 9A is a plan view of the photodetector during a final step of the fabrication of the device of the second embodiment in which the surrounding baked photoresist mask is removed.
Figure 9B:
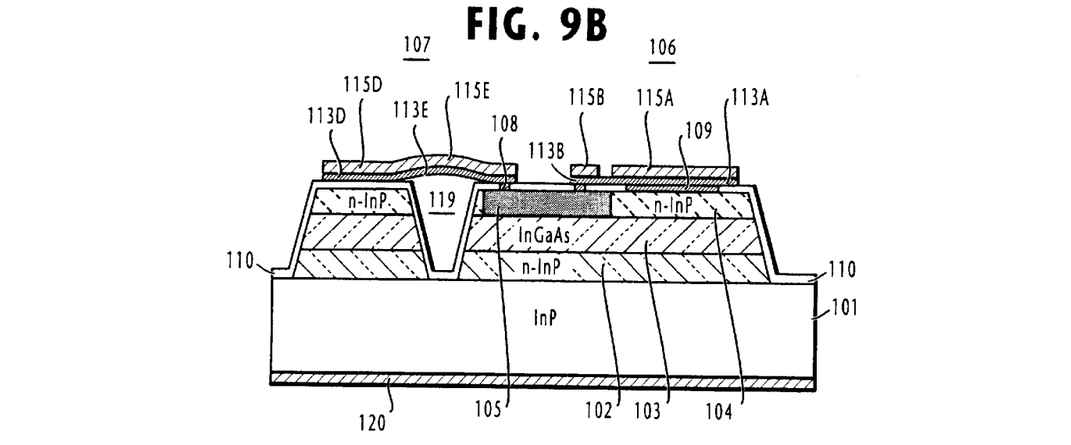
FIG. 9B is a cross-sectional view taken along the lines 9B—9B of FIG. 9A.
Figure 9C:
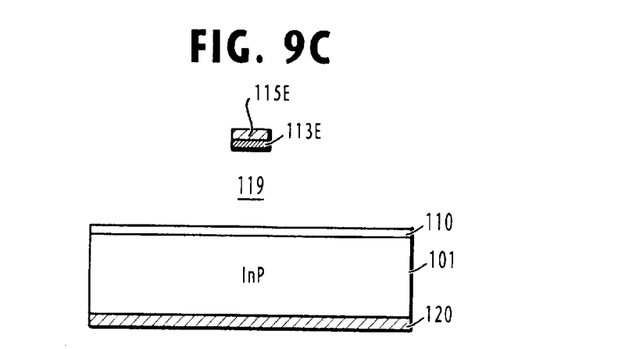
FIG. 9C is a cross-sectional view taken along the lines 9C—9C of FIG. 9A.

After removing the photoreist layer 114, the metal regions 115A, 115B, 115E, 115D are used as a mask for subjecting the device to an ion milling process using Ar to segment the underlying metal layer 113 into several regions 113A, 113B, 113E and 113D corresponding to the overlying metal regions 115A, 115B, 115E and 115D. Instead of the V-shaped laminated interconnect metal line of the previous embodiment, the metal regions 113E and 115E form a bridge extending over the mesa-separating valley as clearly shown in FIG. 8C. By removing the mesa-surrounding resist layer 111, a void is created below the two-layered metal bridge formed by metal lines 113E and 115E as shown in FIGS. 9A, 9B and 9C. After polishing the bottom of substrate 101, the rear electrode 120 is deposited in the same manner as the previous embodiment.

In addition to the advantageous features described above in relation to the first embodiment of the present invention, the bridging interconnect metal line of the modified embodiment has an extra feature that it needs a smaller length for the interconnect between the mesa structures 106 and 107, regardless of the steepness of the sidewalls of the mesa-separating valley. This is beneficial for lowering the line resistance of the interconnect. A further feature of the bridging structure is that the presence of air below it, instead of the underlying protective layer 110 of the first embodiment, provides a lower line capacitance. These extra features of reduced line resistance and reduced line capacitance are combined together to produce a photodetector that can operate at an increased high speed.

What is claimed is:

1. A semiconductor photodetector comprising:
   a semi-insulating substrate;
   a first layered-semiconductor mesa structure and a second layered-semiconductor mesa structure formed side by side on said substrate, said first layered-semiconductor mesa structure having a photoactive region and a first electrode on said photoactive region and said second layered-semiconductor mesa structure having a pad electrode; and
   an interconnect line of laminated metal structure for establishing a connection between said first electrode and said pad electrode.

2. The semiconductor photodetector of claim 1, wherein said laminated metal structure comprises a lower metal layer and an upper metal layer, the upper metal layer having a greater thickness than the thickness of said lower metal layer.

3. The semiconductor photodetector of claim 1, wherein said interconnect line extends along sidewalls of a valley between said first and second semiconductor mesa structures.

4. The semiconductor photodetector of claim 1, wherein said interconnect line extends as a bridge over a void between said first and second semiconductor mesa structures.

5. The semiconductor photodetector of claim 1, wherein said first electrode is in the shape of a ring, and wherein said first layered-semiconductor mesa structure further includes a second electrode adapted to be biased at a potential opposite to a potential which will be applied to said first electrode when the photodetector is in operation.

* * * * *